United States Patent [19]

Fenn et al.

[11] Patent Number: 5,442,288
[45] Date of Patent: Aug. 15, 1995

[54] MAGNETOELASTIC MAGNETOMETER

[75] Inventors: Ralph C. Fenn, Cambridge; Michael J. Gerver, Brookline; Richard L. Hockney, Lynnfield, all of Mass.; Bruce G. Johnson, Monument, Colo.

[73] Assignee: SATCON Technology Corporation, Cambridge, Mass.

[21] Appl. No.: 52,074

[22] Filed: Apr. 22, 1993

[51] Int. Cl.⁶ .................... G01R 33/02; G01R 33/18; G01B 7/24
[52] U.S. Cl. .................... 324/244; 324/226; 324/260
[58] Field of Search ........ 324/209, 244, 249, 256–260, 324/226

[56] References Cited

U.S. PATENT DOCUMENTS

| | | | |
|---|---|---|---|
| 4,232,265 | 11/1980 | Smirnov | 324/260 |
| 4,297,872 | 11/1981 | Ikeda et al. | 73/32 A |
| 4,769,599 | 9/1988 | Mermelstein | 324/244 |
| 4,806,859 | 2/1989 | Hetrick | 324/257 X |
| 4,891,587 | 1/1990 | Squire | 324/260 X |
| 5,103,174 | 4/1992 | Wandass et al. | 324/260 X |
| 5,130,654 | 7/1992 | Mermelstein | 324/244 |
| 5,290,102 | 3/1994 | Kaiser et al. | 324/244 X |

OTHER PUBLICATIONS

Berry et al; *Magnetoelasticity and Internal Friction of an Amorphous Ferromagnetic Alloy*, Journal of Applied Physics, vol. 47, No. 7 Jul. 1976 pp. 3295–3300.

Berry et al; *Vibrating Reed Internal Friction Apparatus for Films and Foils*, IBM J. Res. Develop, Jul. 1975, pp. 334–343.

Brizzolara et al; *A Tunneling-tip Magnetometer*, Sensors and Actuators, 20 (1989) pp. 199–205.

*Primary Examiner*—Gerard R. Strecker
*Attorney, Agent, or Firm*—Iandiorio & Teska

[57] ABSTRACT

A magnetoelastic magnetometer having a magnetoelastic member for placement in a magnetic field, An effect on the stiffness of the magnetoelastic member caused by the magnetic field is measured, and magnitude of the field is determined in response.

23 Claims, 2 Drawing Sheets

MAGNETOELASTIC MAGNETOMETER

GOVERNMENT RIGHTS

This invention was made with U.S. Government support under Contract No. N00014-91-C-0070, awarded by the Department of the Navy. The Government has certain rights in the invention.

FIELD OF THE INVENTION

This invention relates to a magnetometer employing a magnetoelastic magnetic field detecting member. The change in Young's modulus in the magnetoelastic member caused by a magnetic field is measured to determine the strength of the magnetic field.

BACKGROUND OF INVENTION

There are several types of magnetometers currently being used. The least expensive and least sensitive devices with resolution of about $10^{-1}$ Oersted (Oe)/Hz$^{\frac{1}{2}}$ are Hall probe devices. These devices work by sensing a voltage change across a conductor placed in a magnetic field. Such devices are insensitive and so can not be used in applications requiring greater sensitivity such as required in brain scan devices and magnetic anomaly detection devices.

Flux gate magnetometers are more sensitive, having resolution of approximately $10^{-6}$ Oe/Hz$^{\frac{1}{2}}$. Flux gate magnetometers employ a magnetic core surrounded by an electromagnetic coil, and so are difficult to microfabricate. Additionally, flux gate magnetometers require a relatively large amount of power and accordingly do not lend themselves to a compact, portable design.

The most sensitive magnetometers called SQUIDS (superconducting quantum interference detectors) have a resolution of about $10^{-10}$ Oe/Hz$^{\frac{1}{2}}$. However, because they include a superconducting element these devices must have provision for cooling to liquid gas temperatures, making them extremely bulky and expensive to operate. Their size limits their utility because the active superconducting element can not be placed directly adjacent to the source of the magnetic field, for example the brain.

Accordingly, there is a great need for a small, inexpensive, low power magnetometer that has sufficient sensitivity to be useful for a variety of magnetometer applications.

SUMMARY OF INVENTION

It is therefore an object of this invention to provide a magnetometer having sufficient sensitivity for a variety of applications.

It is a further object of this invention to provide such a magnetometer that is inexpensive to manufacture.

It is a further object of this invention to provide such a magnetometer that uses relatively little power.

It is a further object of this invention to provide such a magnetometer that can be run off batteries.

It is a further object of this invention to provide such a magnetometer that can be mass produced by microfabrication techniques.

It is a further object of this invention to provide such a magnetometer that can be placed directly adjacent the source of the magnetic field.

This invention results from the realization that a small and inexpensive yet extremely sensitive magnetometer may be accomplished by vibrating a magnetoelastic beam at its resonant frequency and monitoring changes in the resonant frequency caused by changes in the Young's modulus of the beam material due to changes in the field strength of a magnetic field in which the beam is immersed to determine the strength of that magnetic field. Vibrating beams are described in "Vibrating Reed Internal Friction Apparatus for Films and Foils", B. S. Derry and W. C. Pritchet, *IBM Journal of Research and Development*, July 1975, page 342, Appendix. The Appendix describes the flexural modes of a cantilever beam. The relationship between Young's modulus of elasticity (E) and resonant frequency is given in the same reference, page 339, Column 1, Equation 8, which states that the resonant frequency of a vibrating cantilever beam is proportional to the square root of Young's modulus.

This invention features a magnetoelastic magnetometer comprising a magnetoelastic member for placement in a magnetic field, means for measuring an effect on the stiffness of the member caused by the magnetic field, and means, responsive to the means for measuring, for determining the magnitude of the magnetic field.

In one embodiment, the magnetometer includes means for oscillating the magnetoelastic member, and the oscillation frequency is resolved and from that frequency the magnetic field amplitude is inferred. The oscillation is preferably at the member resonant frequency. The member may be a cantilever that may be oscillated at resonance by means such as an electrostatic actuator, a piezoelectric actuator, or any other type of device for supplying force to the magnetoelastic member. The resonant oscillation frequency may then be determined by means such as a cantilever follower. In that case, there are included means for oscillating the cantilever follower at the magnetoelastic member resonant oscillation frequency to maintain an essentially constant distance between the cantilever and the cantilever follower. The magnetic field strength may then be determined from the magnetoelastic member oscillation frequency. This may be accomplished by measuring the distance between the cantilever and the cantilever follower. Preferably, the control system includes means for maintaining a constant phase relationship between the magnetoelastic member oscillation frequency and the cantilever follower oscillation frequency.

The magnetometer in one embodiment includes a flux guide for directing the magnetic field through the cantilever. The flux guide may include a fixed magnetoelastic member proximate the cantilever. The cantilever may be a beam and the flux guide may be aligned with and have the same width as the beam. The magnetometer may also include means for magnetically biasing the magnetoelastic member to increase its magnetoelastic sensitivity to the magnetic field. This may be accomplished with one or more permanent magnets.

In an alternative embodiment, the magnetoelastic member is cantilever and the field measurement is based on measurement of the sag of the cantilever. To enhance the sensitivity of the cantilever, there may further be included means for applying an urging force to the free end of the cantilever to increase the magnitude of its sag.

Also featured is a magnetoelastic magnetometer comprising a magnetoelastic cantilever for placement in the magnetic field, means for oscillating the cantilever at its resonant frequency, and means for resolving from the resonant frequency the magnitude of the magnetic field.

In a more specific embodiment, this invention features a magnetoelastic magnetometer comprising a magnetoelastic cantilever for placement in a magnetic field, means for oscillating the magnetoelastic cantilever at its resonant frequency, a following cantilever carrying means for measuring the distance between the magnetoelastic and the following cantilevers, means for oscillating the following cantilever to maintain a constant distance between the magnetoelastic and following cantilever and a constant phase relationship between the cantilever oscillations, and means for resolving from the magnetoelastic cantilever resonant frequency the magnitude of the magnetic field.

DISCLOSURE OF PREFERRED EMBODIMENTS

Other objects, features and advantages will occur to those skilled in the art from the following description of a preferred embodiment and the accompanying drawings in which.

This invention may be accomplished in a magnetoelastic magnetometer in which a magnetoelastic member such as a beam is immersed in a magnetic field. The beam is vibrated at its resonant frequency. That resonant frequency changes as the magnetic field strength changes due to corresponding changes in the Young's modulus of the material from which the beam is made. Accordingly, by monitoring the beam resonant frequency it is possible to determine the magnetic field strength.

Figure 1:
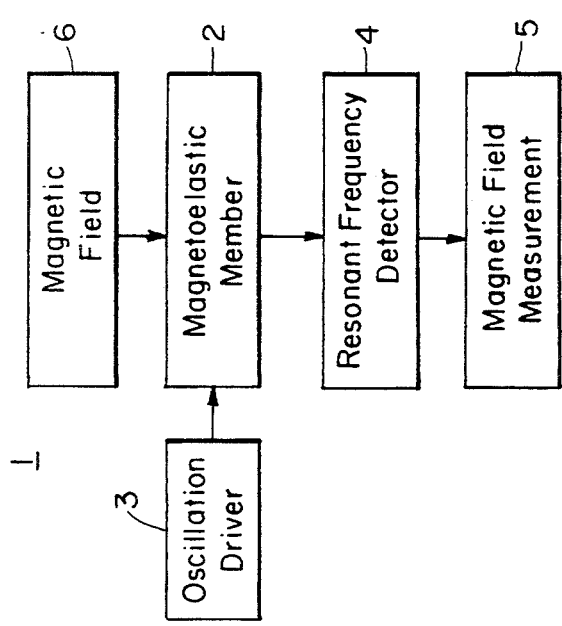
FIG. 1 is a block diagram of a magnetoelastic magnetometer according to this invention.

There is shown in FIG. 1 magnetoelastic magnetometer system 1 according to this invention. The magnetometer includes a magnetoelastic member 2 that preferably has a form such as a beam or diaphragm that may be oscillated. Other forms are described below. Oscillation driver 3 drives magnetoelastic member 2 at its resonant frequency. Because the Young's modulus of member 2 changes as the strength of the magnetic field 6 acting on member 2 changes, the resonant frequency of member 2 will change along with the magnetic field. Accordingly, driver 3 has a variable frequency output to drive member 2 at its resonant frequency. Resonant frequency detector 4 then determines the resonant frequency of member 2, and magnetic field measurement device 5 determines from the resonant frequency the strength of the magnetic field in which member 2 is immersed.

Figure 2A:
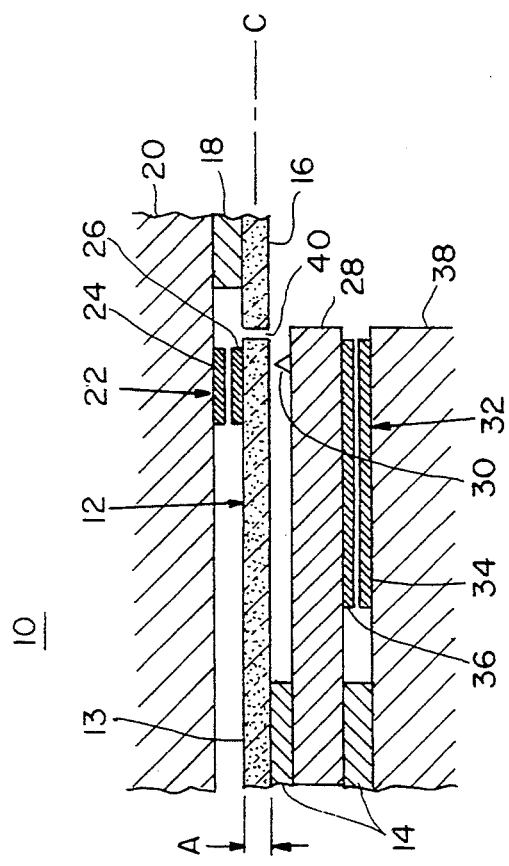
FIG. 2A is an enlarged cross sectional view of a preferred form of the magnetometer according to this invention.

A preferred form of a magnetometer 10 for accomplishing the magnetoelastic magnetometer according to this invention is shown in cross section in FIG. 2A. This embodiment is a double cantilever system in which the magnetoelastic cantilever 12 is vibrated as its resonant frequency by an electrostatic actuator 22 comprising actuator member 26 carried by vibrating beam 12 and actuator member 24 fixed to fixed member 20. Beam-following cantilever 28 is similarly driven by electrostatic driver 32 comprising member 36 fixed to vibrating beam 28 and member 34 fixed to fixed member 38. Distance measurement device 30 such as a tunnelling tip distance measurement device measures the distance between beam 28 and beam 12.

The system is operated so that beam 12 is driven at is resonant frequency, and beam 28 is driven to maintain a constant distance between the two beams as measured by measurement device 30. The phase of the position measurement signal is then compared to that of the magnetoelastic beam excitation signal, and the phase lag is maintained at an appropriate constant value by adjusting the magnetoelastic beam excitation frequency. The excitation frequency maintaining the proper phase relationship is directly related to the strength of the magnetic field in which beam 12 is immersed along the longitudinal axis C of beam 12. Operation at resonant frequency greatly decreases the required actuator power, allowing the device to be run off a battery.

Magnetoelastic beam 12 is preferably made from an amorphous metallic glass such as Metglas 2605S2 manufactured by Allied Corporation. This material has a high permeability and large field-induced Young's modulus changes making it well suited for the application. Beam 12 may be sputter deposited using microfabrication techniques and is preferably approximately 700 microns wide, 700 microns long, and has a thickness A of approximately 100 microns. Member 12 is preferably placed approximately in the middle of an elongated flux guide comprising extension 13 of member 12 held within or on fixed member 14, and elongated member 16 held within or on fixed member 18 and made of the same material as the vibrating beam to comprise a long, thin flux guide having a length of approximately 5 centimeters, a width of 700 microns and a thickness of 100 microns. Gap 40 is introduced to create cantilevered beam 12 while not substantially disrupting the magnetic field carried through the flux guide.

Tunneling displacement sensor 30 uses existing tunnelling displacement measurement technology for measuring distances down to the Angstrom level so that cantilever 28 can exactly follow cantilever 12 for very accurate magnetic field strength measurement. For a single beam design, member 28 would be fixed, and member 32 eliminated. The advantage of a dual beam design is increased oscillation magnitude, resulting in increased magnetometer sensitivity.

Figure 2B:
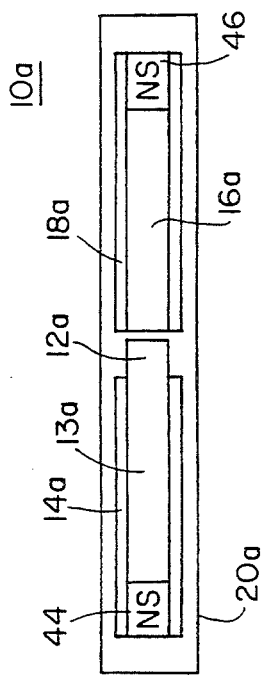
FIG. 2B is a top view of the embodiment of FIG. 2A.

A top view of the design of FIG. 2A is shown in FIG. 2B. Magnetometer 10a includes magnetoelastic cantilever 12a projecting from support 14a which also carries the fixed portion of flux guide 13a. Similarly, support 18a carries fixed portion 16a of the flux guide. Members 14a and 18a are carried on substrate 20a. Permanent magnets 44 and 46 are preferably place at the two ends of the flux guide to magnetically bias cantilever 12a with a constant strength of field to operate the cantilever where it is more sensitive to changes in magnetic field strength, typically approximately one half of the cantilever saturation flux where the slope of the field strength versus Young's modulus curve is steep. This bias may be approximately one Oersted.

Figure 3:
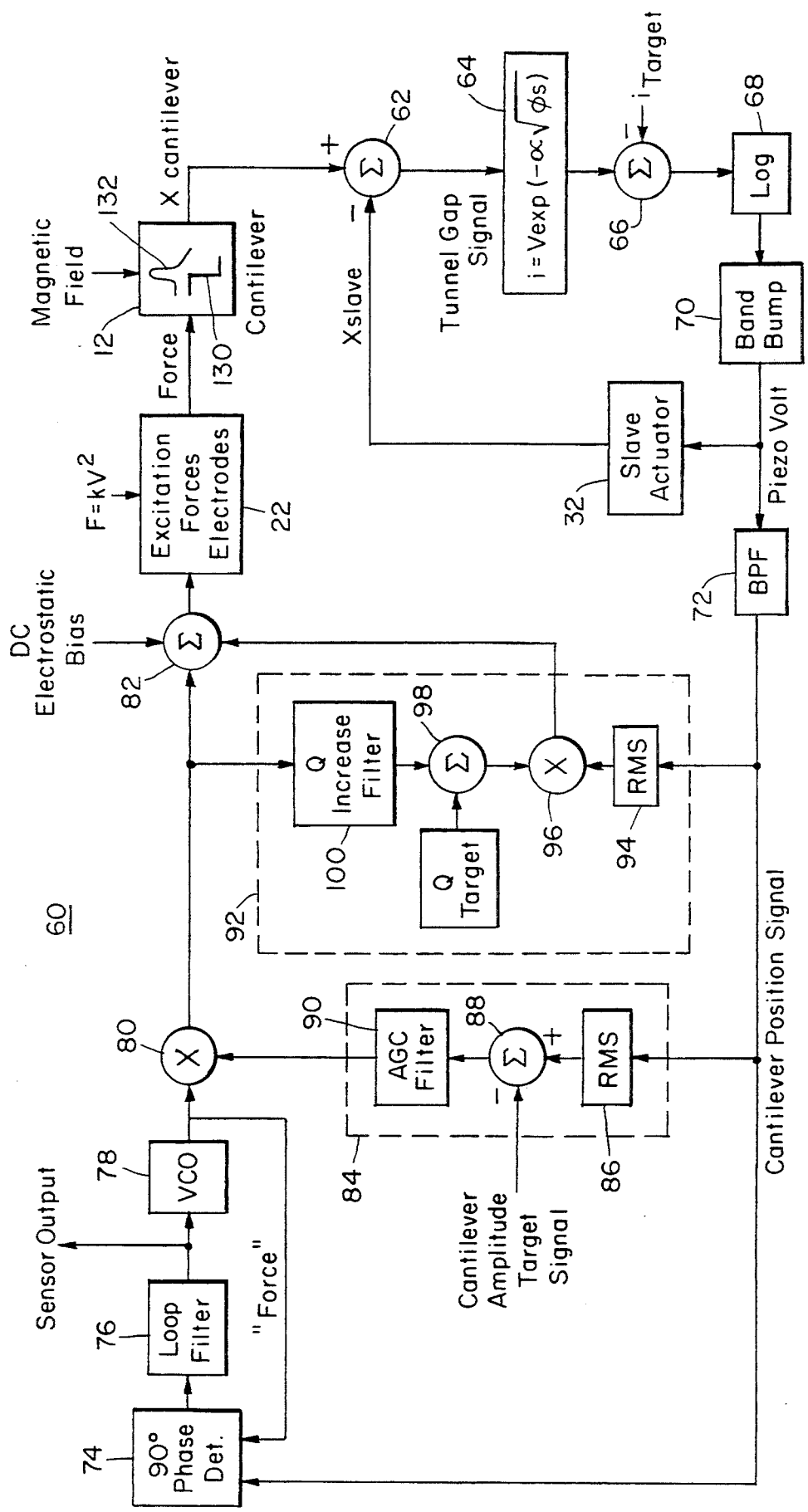
FIG. 3 is a schematic block diagram of the control and detection system for the magnetometer of FIG. 2A.

FIG. 3 details a block diagram of control and detection system 60 for the magnetometer construction of FIG. 2A. Magnetoelastic cantilever 12 is represented by Bode magnitude plot 132 and phase plot 130. Magnetoelastic cantilever excitation force electrodes are driven as described below to oscillate cantilever 12 at the peak of the Bode plot where the phase change with frequency is greatest to achieve highest possible resolution. Control system 60 uses a phase-locked loop to produce a force excitation frequency equal to the resonant frequency of the magnetoelastic cantilever. The phase-locked frequency is proportional to the ambient field and is used as the sensor output. The position of the cantilever and the position of the slave or following beam 28 are in effect summed by summer 62 to produce a change in the tunneling gap signal and consequently a change in tunnelling current i, block 64, in which V is the tunneling gap bias voltage, alpha is a constant (1.025 $eV^{-\frac{1}{2}}Å^{-1}$), phi is the energy barrier height, and s is the tunneling gap. Summer 66 compares the tunnel gap signal to a target signal representing the correct current and consequently the correct distance between the vibrating beam and the reed follower cantilever. The log of the combined signals is taken, block 68, and narrow band, high gain filter 70 is used to enhance the tracking accuracy of beam 28 as beam 12 oscillates. The output of filter 70 is a voltage signal proportional to the displacement of reed follower 28 that is returned to actuator 32 for driving the follower to maintain a constant distance between the follower and the magnetoelastic cantilever. The output of block 70 is ideally the position of both beams when perfect tracking occurs. This same signal is very close to the position of beam 12 and is provided to band pass filter 72, which is used to significantly reduce both low frequency and high frequency signal noise. The filtered signal is a signal indicative of the position of the magnetoelastic beam that is provided to a phase lock loop having a 90° phase determinator 74 that compares the output from the cantilever tunneling position sensor to the output sinusoid from voltage-controlled oscillator 78 to produce an error signal. Loop filter 76 compensates the signal. The result is a sinusoidal signal out of oscillator 78 that effectively maintains a desired 90° phase lag between the force applied to the magnetoelastic cantilever and the cantilever displacement.

Constant loop gain is maintained by automatic gain control stage 84 that monitors the amplitude of the magnetoelastic cantilever oscillations and adjusts the loop gain to maintain constant amplitude by comparing the cantilever position signal to a constant cantilever amplitude target signal, filtering that signal, and then multiplying the filtered signal in multiplier 80 by the force sinusoid from oscillator 78 at summer 88, the RMS cantilever position signal, calculated at filter 86, is compared to a constant cantilever amplitude target signal, and automatic gain control filter 90 adjusts the signal level which is then multiplied in multiplier 80 by the force sinusoid from oscillator 78. The resulting signal is applied to summer 82 that sums that signal with a DC electrostatic bias signal to account for the nonlinear response of excitation force electrodes 22. The application of a DC bias creates a DC signal with the sinusoid superimposed thereon so that the response of the force electrodes is closer to being sinusoidal to create a single frequency component with low amplitude harmonics. The resulting signal is used by Q feedback controller 92 which is designed to keep the cantilever Q at a relatively high but constant level of perhaps $10^5$ using filter 100 and summer 98 that is also supplied with a target Q level, whose output is multiplied at multiplier 96 by the RMS magnetoelastic position signal calculated in component 9 and provided to multiplier 82.

Circuit 60 thus determines and drives the magnetoelastic cantilever at its resonant frequency. Since the resonant frequency depends on magnetic field strength, a measure of the frequency is produced. The output of loop filter 76 is an analog signal proportional to resonant frequency and can serve as the sensor output. Also, the number of cycles of VCO 78 can be counted over a fixed time period to deduce frequency and magnetic field. This circuit has two significant advantages over simply inferring the resonant frequency shift from the bode magnitude at an off-peak frequency. One advantage of feeding back the position phase rather than its amplitude response is that cantilever Q changes do not affect the apparent frequency shift. The advantage of using automatic gain control is that cantilever Q changes do not affect the voltage controlled oscillator loop gain or closed loop stability, thereby allowing very high Q values under closed loop control. Another advantage of using the resonant mating cantilever is that only noise near the resonant frequency appears in the sensor output. The modulation noise by the cantilever resonant frequency reduces 1/f sensor noise.

Figure 4:
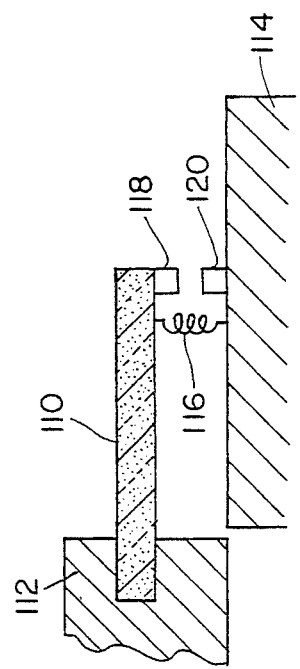
FIG. 4 is an enlarged cross sectional schematic view of an alternative magnetometer construction according to this invention.

For a single cantilever design such as that shown in FIG. 4, the tunneling tip or other displacement sensor would be fixed. FIG. 4 also illustrates using the principle of this invention in a non-oscillating magnetoelastic member. Magnetoelastic cantilever 110 is fixed at one end and fixed member 112 and displacement sensors 118 and 120 are provided for determining the distance between fixed member 114 and cantilever 110 that is biased down by spring 16. As the strength of the magnetic field along the longitudinal axis of beam 110 changes, the deflection of beam 110 alters. This deflection is measured by displacement sensors 118 and 120 as a means of determining the magnetic field strength.

For a single oscillating cantilever design, the reed oscillation amplitude has to be maintained within the measurement distance of the displacement sensor. For a tunneling tip sensor, the reed oscillation would have to be approximately ±2 Angstroms, which would result in a smaller signal to noise ratio. Accordingly, the dual beam design has greater sensitivity.

There are numerous alternative designs that may employ a magnetoelastic member and then determine the magnetic field strength by measuring an effect on the stiffness of that member caused by the magnetic field. Such a device could take advantage of any measurable effect of the magnetic field on the Young's modulus of the magnetoelastic member. For example, since the speed of propagation of sound in a material is dependent on the Young's modulus, a magnetometer employing this principle could be designed with a member for producing the sound and then some means of measuring the speed of propagation of the sound and determining from that the magnetic field strength, for example by calibrating the magnetoelastic member in advance with magnetic fields of known strength.

Although specific features of tile invention are shown in some drawings and not others, this is for convenience only as some feature may be combined with any or all of the other features in accordance with the invention.

Other embodiments will occur to those skilled in the art and are within the following claims:

What is claimed is:

1. A magnetoelastic magnetometer, comprising:
a magnetoelastic member for placement in a magnetic field;
electromechanical means, proximate to said member, for measuring a change in the modulus of elasticity of said magnetoelastic member caused by the magnetic field; and means responsive to said means for measuring for determining the magnitude of the magnetic field.

2. The magnetoelastic magnetometer of claim 1 further including means for vibrating said magnetoelastic member.

3. The magnetoelastic magnetometer of claim 2 in which said means for measuring includes means for resolving the magnetoelastic member vibration frequency.

4. The magnetoelastic magnetometer of claim 3 in which said means for determining includes means for inferring the magnetic field amplitude from the vibration frequency.

5. The magnetoelastic magnetometer of claim 2 in which said means for vibrating vibrates said magnetoelastic member at its resonant frequency.

6. The magnetoelastic magnetometer of claim 1 in which said magnetoelastic member is a magnetoelastic cantilever member supported on one end thereof by support means.

7. The magnetoelastic magnetometer of claim 6 further including means for vibrating said magnetoelastic cantilever member at its resonant frequency.

8. The magnetoelastic magnetometer of claim 7 in which said means for vibrating includes an electrostatic actuator for vibrating said magnetoelastic cantilever member.

9. The magnetoelastic magnetometer of claim 7 in which said means for measuring an effect on the elasticity of said magnetoelastic cantilever member includes means for resolving the magnetoelastic cantilever member resonant vibration frequency.

10. The magnetoelastic magnetometer of claim 9 in which said means for resolving includes a second cantilever mounted parallel to said first cantilever member.

11. The magnetoelastic magnetometer of claim 10 in which said means for resolving further includes means for vibrating said cantilever follower member at the resonant vibration frequency of the magnetoelastic cantilever member to maintain an essentially constant distance between said magnetoelastic cantilever member and said cantilever follower member.

12. The magnetoelastic magnetometer of claim 11 in which said means for resolving further includes means for determining said magnetoelastic cantilever member vibration frequency.

13. The magnetoelastic magnetometer of claim 12 further including means for measuring the distance between said magnetoelastic cantilever member and said cantilever follower member.

14. The magnetoelastic magnetometer of claim 11 further including means for maintaining a constant phase relationship between said magnetoelastic cantilever member vibration frequency and said cantilever follower member vibration frequency.

15. The magnetoelastic magnetometer of claim 6 further including a flux guide for directing the magnetic field through said magnetoelastic cantilever.

16. The magnetoelastic magnetometer of claim 15 in which said flux guide includes a fixed magnetoelastic member proximate said magnetoelastic cantilever member, said fixed magnetoelastic member supported by said support means.

17. The magnetoelastic magnetometer of claim 16 in which said magnetoelastic cantilever member is a beam and said flux guide is aligned with and has the same width as said beam.

18. The magnetoelastic magnetometer of claim 1 further including means for magnetically biasing said magnetoelastic member to increase its magnetoelastic sensitivity to the magnetic field.

19. The magnetoelastic magnetometer of claim 18 in which said means for biasing includes one or more permanent magnets.

20. The magnetoelastic magnetometer of claim 6 in which said means for measuring an effect includes means for measuring the sag of said cantilever.

21. The magnetoelastic magnetometer of claim 20 further including means for applying an urging force to the free end of said cantilever for increasing the magnitude of the cantilever sag.

22. A magnetoelastic magnetometer, comprising:
a magnetoelastic cantilever member for placement in a magnetic field;
means for vibrating said magnetoelastic cantilever member at its resonant frequency;
a second cantilever member;
means for measuring the distance between said magnetoelastic cantilever member and said following cantilever member;
means for vibrating said following cantilever member to maintain a constant distance between said magnetoelastic cantilever member and said following cantilever member and to maintain a constant phase relationship between the cantilever vibrations; and
means responsive to the resonant frequency of said magnetoelastic cantilever member, for resolving magnitude of the magnetic field.

23. A magnetoelastic magnetometer comprising:
a magnetoelastic cantilever member for placement in a magnetic field;
means for vibrating said magnetoelastic cantilever member at its resonant frequency; and
means responsive to the resonant frequency of the magnetoelastic cantilever member for resolving the magnitude of the magnetic field.

* * * * *